US007224556B2

(12) United States Patent
Pinarbasi

(10) Patent No.: US 7,224,556 B2
(45) Date of Patent: May 29, 2007

(54) SELF-PINNED CPP MAGNETORESISTIVE SENSOR

(75) Inventor: Mustafa Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 124 days.

(21) Appl. No.: 10/280,778

(22) Filed: Oct. 24, 2002

(65) Prior Publication Data

US 2004/0080875 A1  Apr. 29, 2004

(51) Int. Cl.
*G11B 5/39* (2006.01)

(52) U.S. Cl. .................................. 360/324.11

(58) Field of Classification Search ............. 360/324.2, 360/110, 313, 323, 324, 324.1, 324.11, 324.12; 257/421; 324/252
See application file for complete search history.

(56) References Cited

U.S. PATENT DOCUMENTS

| | | | |
|---|---|---|---|
| 5,583,725 A | 12/1996 | Coffey et al. ............... 360/110 |
| 5,640,343 A | 6/1997 | Gallagher et al. ........... 365/171 |
| 6,005,753 A | 12/1999 | Fontana, Jr. et al. ........ 360/110 |
| 6,023,395 A | 2/2000 | Dill et al. ................... 360/110 |
| 6,114,719 A | 9/2000 | Dill et al. ................... 257/295 |
| 6,117,569 A * | 9/2000 | Lin et al. ..................... 428/692 |
| 6,166,948 A | 12/2000 | Parkin et al. ............... 365/173 |
| 6,219,208 B1 | 4/2001 | Gill ........................ 360/324.01 |
| 6,331,943 B1 | 12/2001 | Naji ........................... 365/158 |
| 6,611,405 B1 * | 8/2003 | Inomata et al. ........... 360/324.2 |
| 2001/0004798 A1 | 6/2001 | Gill .......................... 29/603.14 |
| 2003/0184919 A1* | 10/2003 | Lin et al. .................... 360/314 |
| 2004/0075959 A1* | 4/2004 | Gill ....................... 360/324.12 |

OTHER PUBLICATIONS

IBM Tech. Discl. Bull., Dec. 1, 2001, "Self-Pinned Tunnel Valve Head", No. 452, p. 2106.*
Research Disclosure 448164 Aug. 2001, In-stack HB Structure for Tunnel Valve, 1424.
Research Disclosure 448144, Aug. 2001, Exchange Tab and In-Stack Bias Structure For Tunnel Valve, 1412.

* cited by examiner

*Primary Examiner*—Julie Anne Watko
(74) *Attorney, Agent, or Firm*—Zilka-Kotab, PC

(57) ABSTRACT

A charge-perpendicular-to-plane self-pinned magnetic tunnel junction sensor is provided. Additionally, a disk drive using a charge-perpendicular-to-plane self-pinned magnetic tunnel junction sensor as the read element is provided.

5 Claims, 5 Drawing Sheets

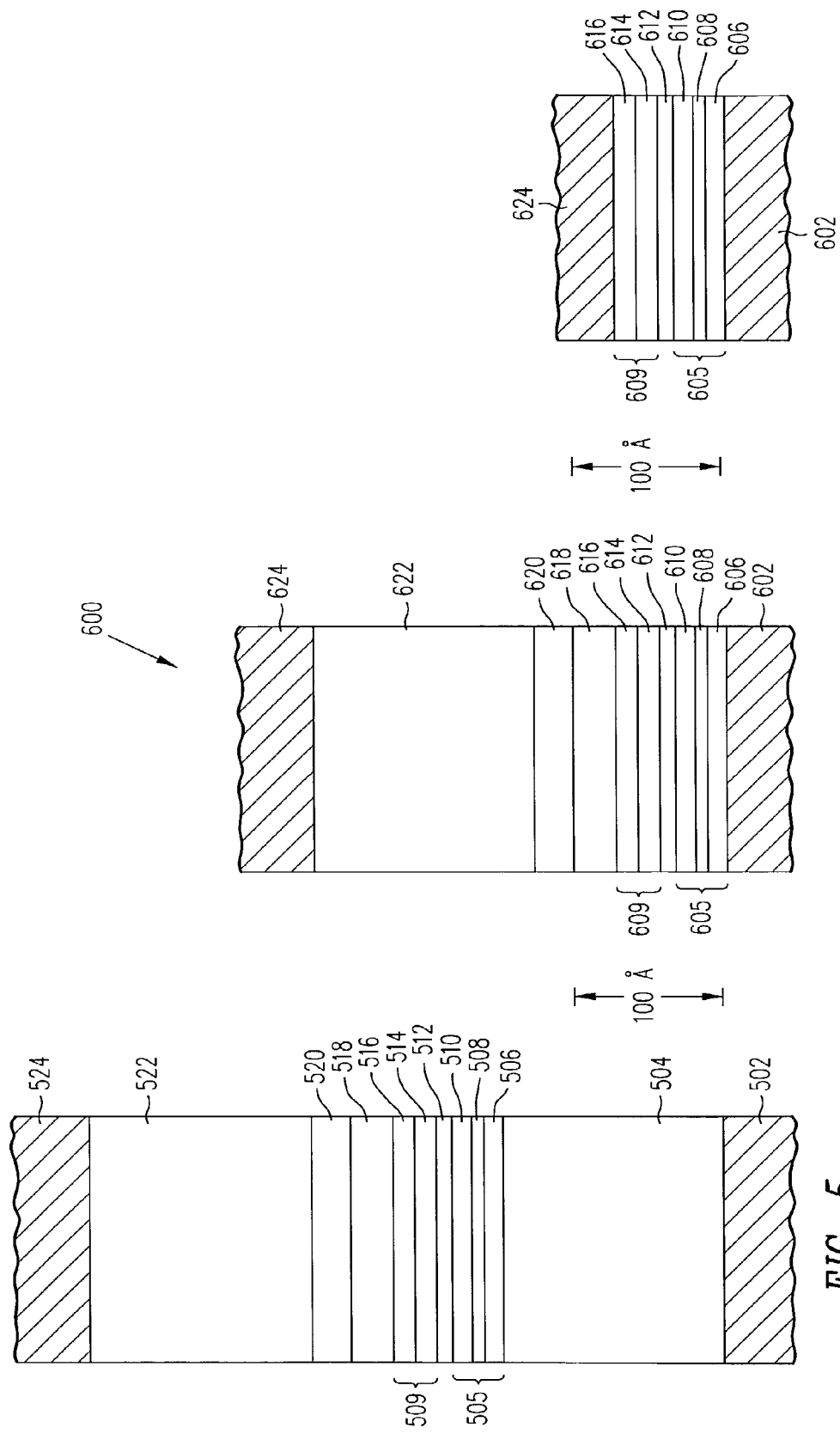

SELF-PINNED CPP MAGNETORESISTIVE SENSOR

BACKGROUND OF THE INVENTION

1. Field of the Invention

The invention relates to magnetic tunnel junction sensors typically used in magnetic disk drives and MRAM memory devices; and, more specifically to self-pinned magnetic tunnel junction sensors.

2. Description of the Background Art

Disk drives using magnetic recording of digital information store most of the information in contemporary computer systems. A disk drive has at least one rotating disk with discrete concentric tracks of data. Each disk drive also has at least one recording head typically having a separate write element and read element for writing and reading the data on the tracks. The recording head is constructed on a slider and the slider is attached to a suspension. The combination of the recording head, slider, and suspension is called a head gimbal assembly. In addition, there is an actuator which positions the recording head over the specific track of interest. The actuator first rotates to seek the track of interest and after positioning the recording head over the track, maintains the recording head in close registration to that track. The disk in a disk drive has a substrate and a magnetic layer formed over the substrate for magnetic recording. The slider carrying the recording head has a disk facing surface upon which an air bearing is constructed. The air bearing allows the slider to float on a cushion of air and to be positioned close to the disk surface. Alternatively, the slider surface facing the disk can be adapted for partial or continuous contact with the disk.

The read element in most contemporary disk drives is a current-in-plane (CIP) spin valve sensor. A spin valve sensor is a sandwich of layers including a ferromagnetic pinned layer, a nonmagnetic electrically conducting layer, and a ferromagnetic free layer. The resistance of the spin valve sensor changes with respect to the direction and magnitude of an applied magnetic field such as the field from a written magnetic transition on a disk. To detect the change in resistance, sense current is passed through the sensor. The sense current is passed along the plane defined by the sandwich of layers and accordingly the sensor is referred to as a current-in-plane (CIP) sensor. Generally, any other layers such as the substrate or seed layers associated with a CIP spin valve sensor should be formed from an electrically insulating material to avoid current shunting and subsequent loss of sensitivity of the sensor.

Current-perpendicular-to-plane (CPP) magnetic tunnel junction sensors are more sensitive than CIP spin valve sensors. Each new generation of disk drives generally has a higher density of recorded information. As the size of recorded bits of information on the disk is reduced, the sensitivity of the read element becomes more important. Thus, CPP magnetic tunnel junction sensors are desirable for high density magnetic recording applications. A CPP magnetic tunnel junction sensor operates according to a different physical principle than a CIP spin valve sensor. A CPP magnetic tunnel junction sensor includes a sandwich of layers including a pinned layer and free layer. The pinned layer is separated from the free layer by a thin nonmagnetic, insulating layer. Sense current is applied perpendicular to the plane of the sandwich of layers. The electrons of the sense current pass through the thin insulating layer according to a quantum mechanical effect called tunneling. The magnitude of the tunneling current depends on the direction of the magnetization in the free layer relative to the direction of the net magnetization in the pinned layer.

The direction of net magnetization in the pinned layer is typically held in place with an adjacent antiferromagnetic layer which is exchange coupled with the pinned layer. The antiferromagnetic layer is relatively thick and requires initialization to be effective. The initialization usually requires the antiferromagnetic layer be annealed at an elevated temperature in the presence of a magnetic field. Some tunnel junction sensors employ a second antiferromagnetic layer indirectly coupled to the free layer for magnetic bias stabilization of the free layer. This second antiferromagnetic layer also requires initialization and the required direction of the second magnetic annealing field is orthogonal to the direction of the magnetic annealing field used for the antiferromagnetic layer coupled to the pinned layer. Thus two initialization steps are required for a conventional magnetic tunnel junction sensor. Because of the complexity of using two orthogonal initialization magnetic fields, a conventional magnetic tunnel junction sensor with two antiferromagnetic layers is difficult to manufacture. All the layers in a CPP tunnel junction sensor except for the insulating layer between the pinned layer and the free layer are necessarily electrically conductive.

A CPP magnetic tunnel junction sensor is constructed between two magnetic shields in order to control the spatial resolution along the direction of the recorded track on the disk. As the gap between the two magnetic shields is reduced, the spatial resolution improves and the recording head is better able to support higher recorded densities. Thus it is very desirable for the sandwich of layers which comprise the sensor be as thin as possible. Thus what is needed is a CPP magnetic tunnel junction sensor which is very thin and easy to manufacture.

SUMMARY OF THE INVENTION

In a preferred embodiment, the invention provides a CPP self-pinned magnetic tunnel junction sensor which is very thin and does not require an antiferromagnetic layer for the pinned layer. In a preferred embodiment the CPP sensor includes a conductive seed layer, a ferromagnetic pinned layer which has two ferromagnetic layers separated by a ruthenium coupling layer, an insulating layer, and a free layer. The pinned layer is self-pinned so that an antiferromagnetic layer is not required to establish the direction of the net magnetization in the pinned layer. In another embodiment of the invention, a disk drive is provided having a CPP magnetic tunnel junction read element which is self-pinned and does not require an antiferromagnetic layer to pin the direction of the net magnetization in the pinned layer. Briefly, a CPP self-pinned magnetic tunnel junction sensor according to the present invention has improved spatial resolution and has simpler manufacturing requirements. Other benefits and advantages of the invention will become apparent from the drawings and detailed description which follow.

BRIEF DESCRIPTION OF THE DRAWINGS

FIG. 5 illustrates a magnetic tunnel junction sensor according to the prior art;

FIG. 6a illustrates one embodiment of a self-pinned magnetic tunnel junction sensor; and, FIG. 6b illustrates an alternate embodiment of a self-pinned magnetic tunnel junction sensor.

DETAILED DESCRIPTION OF THE INVENTION

The invention is embodied in a self-pinned magnetic tunnel junction sensor. The sensor thus provided does not require an antiferromagnetic layer to establish the direction of the net magnetization in the pinned layer substructure. The sensor has a beneficially smaller read gap and is easier to manufacture.

Figure 1:
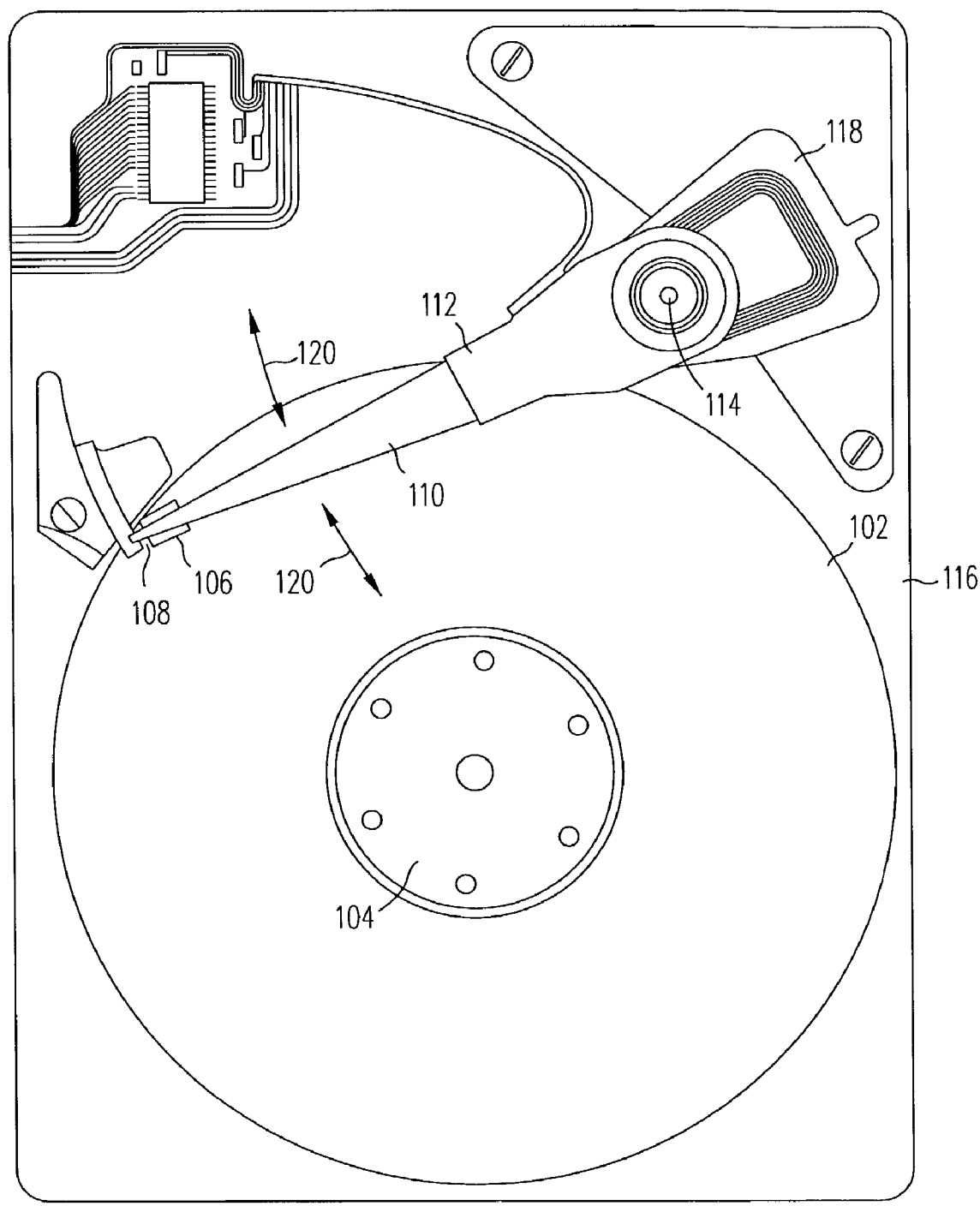
FIG. 1 illustrates a top view of a disk drive.

Referring to FIG. 1, a magnetic disk drive 100 has at least one rotatable magnetic disk 102 supported by a spindle 104 and rotated by a motor (not shown). There is at least one slider 106 with an attached recording head 108 positioned over the disk 102 surface while reading and writing. The recording head 108 contains a write element and a self-pinned magnetic tunnel junction sensor (shown in detail below) as a read element. The slider 106 is attached to a suspension 110 and the suspension 110 is attached to an actuator 112. The actuator 112 is pivotally attached 114 to the housing 116 of the disk drive 100 and is driven by a voice coil motor 118. As the disk is rotating, the actuator 112 positions the slider 106 along with the suspension 110 radially or along an arcuate path 120 over the disk 102 surface to access the data track of interest.

Referring to FIG. 1, during operation of the disk drive 100, the motion of the rotating disk 102 relative to the slider 106 generates an air bearing between the slider 106 and the disk 102 surface which exerts an upward force on the slider 106. This upward force is balanced by a spring force from the suspension 110 urging the slider 106 toward the surface of the disk 102. Alternatively, the slider 106 may be in either partial or continuous contact with the disk 102 surface during operation.

Figure 2:
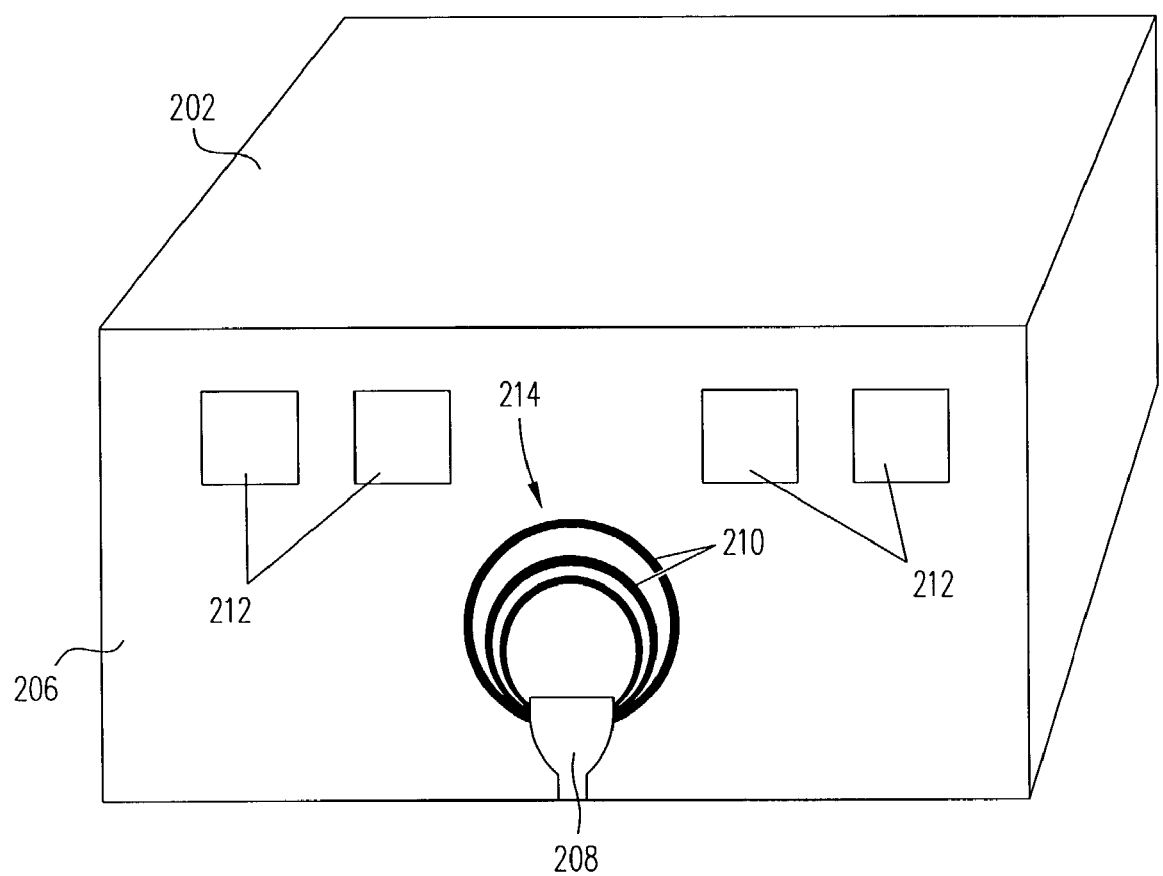
FIG. 2 illustrates a perspective view of a slider.

FIG. 2 illustrates a more detailed view of a slider 202. The recording head is preferably constructed on the trailing surface 206 of the slider 202. FIG. 2 illustrates the upper pole 208 and the turns 210 of the coil 214 of the write element of the recording head. The read element is formed between the slider 202 and the write element and is thus not illustrated in FIG. 2. The electrical connection pads 212 which allow connection with the write element and read element are illustrated.

Figure 3:
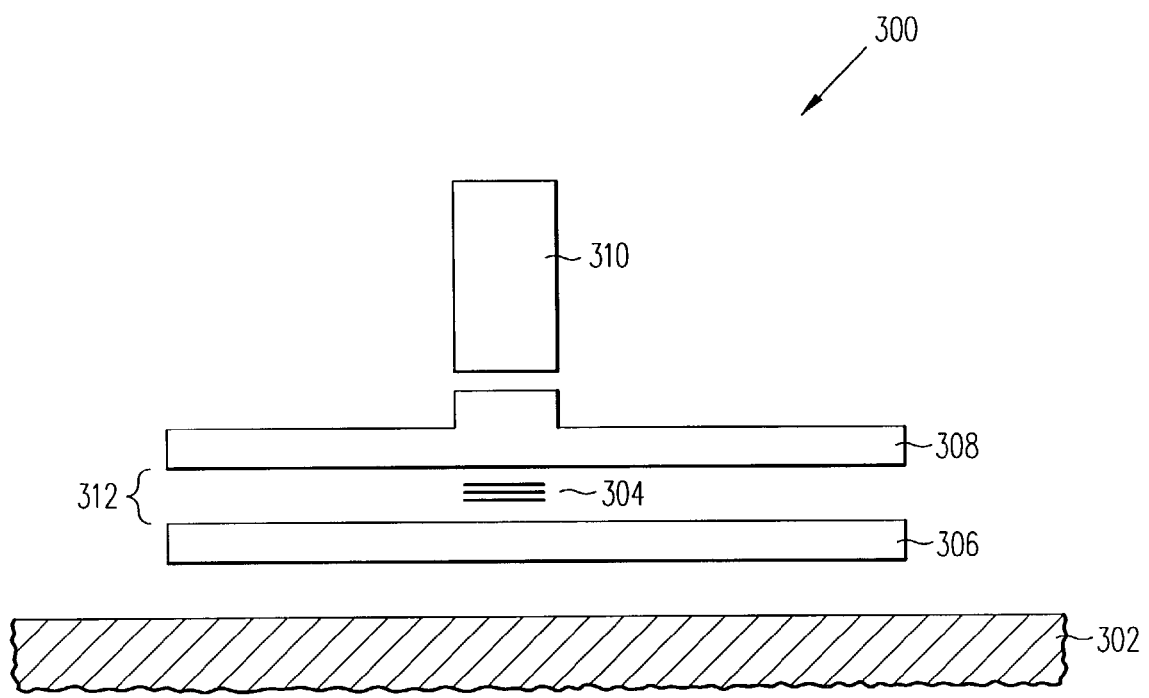
FIG. 3 illustrates a view of a recording head on the disk facing side of a slider.

FIG. 3 illustrates a view of the recording head 300 from the disk facing side of the slider 302. The read element 304 is positioned between a first magnetic shield 306 and a second magnetic shield 308. Usually the second magnetic shield 308 also serves as the first pole of the write element. The second pole 310 of the write element is illustrated. The read gap 312 is the distance between the first 306 and second 308 magnetic shields and strongly influences the spatial resolution of the read element 304. A very thin read element is desirable to accommodate a thin read gap.

Figure 4A:
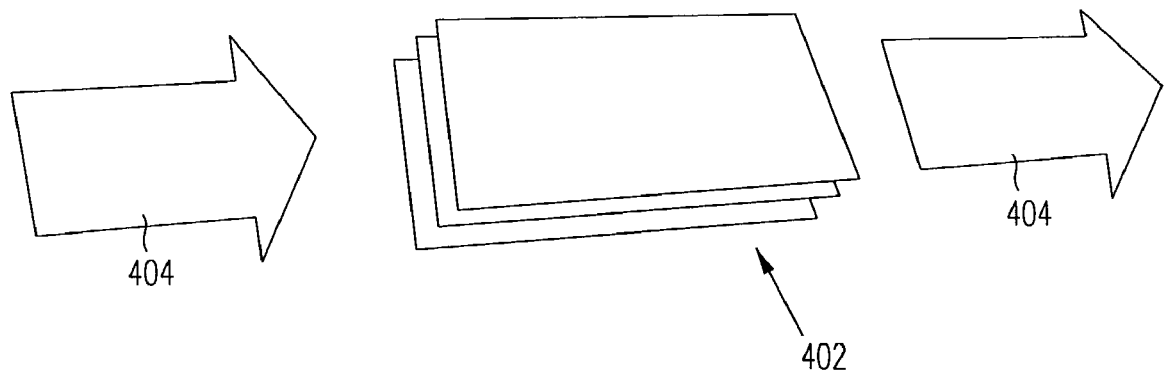
FIG. 4a illustrates the sense current through a CIP spin valve sensor.
Figure 4B:
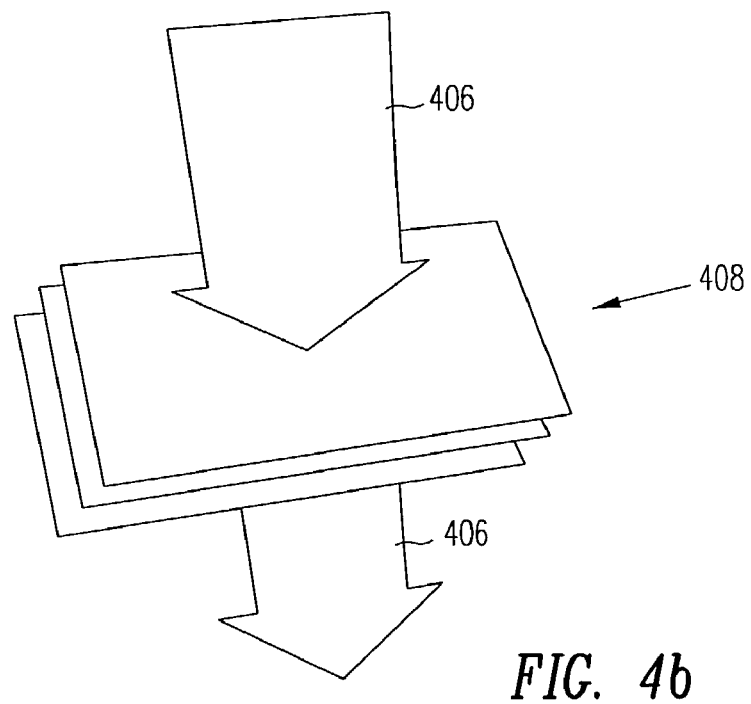
FIG. 4b illustrates the sense current through a CPP magnetic tunnel junction sensor.

FIG. 4a illustrates the orientation of the sense current 404 in a CIP conventional spin valve sensor 402. The sense current 404 is passed along the plane of the sandwich of layers of the sensor 402. It is important to use insulating or high resistance materials in a CIP spin valve sensor for all the layers except for the pinned layer, the free layer, and the nonmagnetic conducting layer between the pinned and free layers. Otherwise shunting of the sense current will degrade the sensitivity. FIG. 4b illustrates the orientation of the sense current 406 in a CPP magnetic tunnel junction sensor 408. The CPP magnetic tunnel junction sensor 408 operates according to a different principle than a conventional CIP spin valve sensor. The magnitude of the spin dependent quantum mechanical tunneling current depends on the direction of the magnetization in the free layer relative to the direction of the net magnetization in the pinned layer. Because of the perpendicular orientation of sense current 406 it is important to use conductive materials for all layers except for the thin insulating layer between the pinned and free layers.

FIG. 5 illustrates a CPP magnetic tunnel junction sensor according to the prior art. The thickness values of the layers in the sandwich of layers are drawn approximately to scale. The sandwich of layers are constructed on a conductive substrate 502 which may have a thin conductive seed layer. A layer 504 of antiferromagnetic material such as PtMn, NiMn or other suitable material is formed above the substrate 502. A pinned layer may consist of a single layer of ferromagnetic material. More commonly, a pinned layer is formed as an antiparallel coupled pinned layer substructure 505 including a first ferromagnetic layer 506, a thin coupling layer of ruthenium 508, and a second ferromagnetic layer 510. A thin layer 512 of insulating material, usually of alumina, is formed over the pinned layer 505. A free layer may include a single layer of an alloy containing a combination of cobalt, nickel, and iron. A free layer may also be a substructure including more than one layer such as a layer 514 of cobalt-iron formed on the insulating layer 512 and a layer 516 of nickel-iron formed on the cobalt-iron layer. In the exemplary sensor illustrated in FIG. 5, the free layer substructure 509 is magnetically stabilized with instack biasing layers including a spacer layer 518, typically of tantalum, a biasing ferromagnetic layer 520, and a second layer of antiferromagnetic material 522. The biasing ferromagnetic layer 520 maintains a weak magnetic field on the free layer substructure. The weak magnetic field is held in a fixed orientation by the second layer 522 of antiferromagnetic material. A conducting capping or lead layer 524 is then formed over the sensor sandwich of layers.

The tunnel junction sensor according to the prior art and illustrated in FIG. 5 employs two layers 504, 522 of antiferromagnetic material. The purpose of the first antiferromagnetic layer is to firmly establish the direction of net magnetization in the AP pinned substructure 505. The second antiferromagnetic layer 522 provides magnetic stabilization to the free layer substructure 509. Both of the antiferromagnetic layers 504, 522 are very thick compared to the thickness of the other layers. To be effective, the thickness of antiferromagnetic layers are typically between 100–200 Angstroms. Smaller read gaps can be most effectively achieved by eliminating one or both layers 504, 522 of antiferromagnetic material. In addition to a relatively thick read gap, the prior art sensor illustrated in FIG. 5 also has the disadvantage that the two antiferromagnetic layers 504, 522 must be initialized by annealing in the presence of separate magnetic fields. The required directions of the separate magnetic fields are inconveniently orthogonal.

FIG. 6a illustrates one embodiment of the present invention. The CPP magnetic tunnel junction sensor 600 illustrated in FIG. 6a does not have an antiferromagnetic layer adjacent to the pinned layer substructure. A first ferromagnetic layer 606 of the antiparallel coupled pinned layer substructure 605 is formed directly on a conductive lead or seed layer 602. A ruthenium coupling layer 608 is formed on the first ferromagnetic layer 606, and a second ferromagnetic layer 610 of the pinned substructure 605 is formed over the ruthenium coupling layer 608. The pinned layer substructure is sometimes simply referred to as the pinned layer. An insulating layer 612 is formed over the pinned layer substructure 605. A free layer substructure 609 containing one or more ferromagnetic layers 614, 616 is formed over the insulating layer 612. The free layer substructure is sometimes simply referred to as the free layer. In the exemplary sensor 600 illustrated in FIG. 6a, the free layer substructure 609 is magnetically stabilized with instack biasing layers including a spacer layer 618, a biasing ferromagnetic layer 620, and an antiferromagnetic layer 622. A capping or lead layer 622 is formed over the antiferromagnetic layer 622. The exemplary sensor illustrated in FIG. 6a has the advantage of a much smaller read gap compared to the prior art sensor illustrated in FIG. 5. Also the sensor in FIG. 6a has only one antiferromagnetic layer to initialize and therefore does not have the complicating disadvantage of requiring orthogonal initialization magnetic fields. The sensor illustrated in FIG. 6a may have additional layers to enhance the sensitivity better control film properties, lower resistance, or other reasons. The novel aspect of the sensor illustrated in FIG. 6a is the absence of an antiferromagnetic layer adjacent to the pinned layer substructure.

Referring again to FIG. 6a, the direction of net magnetization in the pinned layer substructure 605 is stable because of magnetic anisotropy in the substructure. Two primary sources of magnetic anisotropy arise from stress induced anisotropy as a result of lapping the disk facing surface of the slider, and from shape anisotropy in the sensor. Of the two, stress induced anisotropy is the more important. One of the final steps in the manufacture of a slider with an attached recording head is to lap the disk facing surface. Lapping adjusts the height of the sandwich of layers in the sensor to a desired value. The process of grinding away a portion of the sandwich of layers in the sensor induces vertically oriented stress in the sandwich of layers. Thus after final lapping, the net magnetization in the pinned layer substructure is oriented in a desired vertical direction relative to the disk and is stable with respect to rotation induced by external magnetic fields such as from the recorded transitions on the disk. Effectively, the pinned layer substructure becomes self-pinned during lapping.

An additional advantage of the self-pinned magnetic tunnel junction sensor illustrated in FIG. 6a is that only one antiferromagnetic initialization is needed. Thus the complication arising from two initializations requiring orthogonal magnetic annealing fields is avoided.

FIG. 6b illustrates an alternative embodiment of the present invention. The CPP magnetic tunnel junction sensor illustrated in FIG. 6b does not have an antiferromagnetic layer for either the pinned layer substructure or the free layer. The pinned layer substructure 605 containing a first ferromagnetic layer 606, a ruthenium coupling layer 608, and a second ferromagnetic layer 610 is formed over the conductive substrate 602. The conductive substrate 602 is suitably a conductive seed layer over a shield or lead. An insulating layer 612 is formed over the pinned substructure 605. The free layer substructure 609 containing one or more ferromagnetic layers 614, 616 is formed over the insulating layer 612. A conductive capping layer 624 is formed over the free layer substructure 609.

The exemplary sensor illustrated in FIG. 6b is also self-pinned because the sensor does not require an antiferromagnetic layer adjacent to the pinned layer substructure 605. The direction of net magnetization in the pinned layer substructure 605 is stable because of the stress induced and shape anisotropy as discussed above. The direction of magnetization in the free layer must be responsive to an externally applied magnetic field such as from a written transition on a magnetic disk. However the direction of magnetization in the free layer should have a preferred direction which can be provided by in stack biasing as illustrated in FIG. 6a or by shape anisotropy as illustrated in FIG. 6b. The exemplary sensor illustrated in FIG. 6b has the advantage of a significantly smaller read gap.

An electrostatic discharge (ESD) event may pass enough charge though a self-pinned sensor to perturb the direction of magnetization in the self-pinned layers. The sense current in a CIP self-pinned sensor creates a magnetic field which may amplify the deleterious effects of an ESD event. However, the sense current in a CPP self-pinned sensor does not generate a magnetic field which may exacerbate the effects of an ESD event. Therefore, CPP self-pinned tunnel junction sensors are more robust against ESD perturbations compared to a CIP sensor.

From the foregoing it will be appreciated that the self-pinned CPP magnetic tunnel junction sensor provided by the invention has a significantly smaller read gap and is significantly easier to manufacture than prior art sensors. A self-pinned CPP magnetic tunnel junction sensor thus provided can be advantageously used in a disk drive or as a storage element in an MRAM storage device.

I claim:

1. A self-pinned current perpendicular to plane (CPP) muagnetoresistive magnetic tunnel junction sensor, comprising:
   a conductive seed layer;
   an antiparallel coupled pinned layer substructure formed directly over said conductive seed layer; wherein said antiparallel coupled pinned layer substructure comprises a first ferromagnetic layer, a second ferromagnetic layer, and a ruthenium coupling layer disposed between said first and second ferromagnetic layers, and wherein said antiparallel coupled pinned layer;
   a non-magnetic layer formed directly over said antiparallel coupled pinned layer substructure; and,
   a ferromagnetic free layer substructure formed over said electrically insulating layer;
   wherein said ferromagnetic free layer substructure comprises an alloy of nickel and iron.

2. A self-pinned current perpendicular to plane (CPP) magnetoresistive magnetic tunnel junction sensor, comprising:
   a conductive seed layer;
   an antiparallel coupled pinned layer substructure formed directly over said conductive seed layer; wherein said antiparallel coupled pinned layer substructure comprises a first ferromagnetic layer, a second ferromagnetic layer, and a ruthenium coupling layer disposed between said first and second ferromagnetic layers, and wherein said antiparallel coupled pinned layer;
   a non-magnetic layer formed directly over said antiparallel coupled pinned layer substructure; and,
   a ferromagnetic free layer substructure formed over said electrically insulating layer;
   wherein a conductive cap layer is formed directly over said ferromagnetic free layer substructure.

3. A sensor as in claim 2 wherein said electrically insulating non-magnetic layer comprises alumina.

4. A sensor as in claim 2 wherein said ferromagnetic free layer substructure comprises an alloy of cobalt and iron.

5. A magnetic recording disk drive, comprising:
a magnetic recording disk;
a write element for writing digital information onto said disk;
a self-biased self-pinned current perpendicular to plane (CPP) magnetoresistive sensor for reading digital information from said disk;
wherein said self-pinned CPP magnetoresistive sensor comprises a conductive seed layer;
an antiparallel coupled pinned layer substructure including a first ferromagnetic layer, a second ferrormagnetic layer, and a ruthenium coupling layer disposed between said first and second ferromagnetic layers, said antiparallel coupled pinned layer substructure formed directly over said conductive seed layer, and wherein said antiparallel coupled pinned layer;
a non-magnetic layer formed directly over said antiparallel coupled pinned layer substructure; and,
a ferromagnetic free layer formed over said non-magnetic layer;
wherein said sensor includes a conductive cap layer formed directly over said ferromagnetic free layer.

* * * * *

UNITED STATES PATENT AND TRADEMARK OFFICE
CERTIFICATE OF CORRECTION

PATENT NO. : 7,224,556 B2
APPLICATION NO. : 10/280778
DATED : May 29, 2007
INVENTOR(S) : Mustafa Pinarasi It is certified that error appears in the above-identified patent and that said Letters Patent is hereby corrected as shown below:

In claim 1, column 6, line 31, please replace "muagnetoresistive" with --magnetoresistive--.

Signed and Sealed this

Eighth Day of June, 2010

David J. Kappos
*Director of the United States Patent and Trademark Office*